United States Patent
Moon

(10) Patent No.: US 12,040,801 B2
(45) Date of Patent: Jul. 16, 2024

(54) RANDOM PULSE GENERATOR AND MEMORY

(71) Applicant: SK hynix Inc., Gyeonggi-do (KR)

(72) Inventor: Hong Ki Moon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 19 days.

(21) Appl. No.: 17/976,096

(22) Filed: Oct. 28, 2022

(65) Prior Publication Data
US 2023/0402999 A1     Dec. 14, 2023

(30) Foreign Application Priority Data
Jun. 8, 2022 (KR) .................. 10-2022-0069520

(51) Int. Cl.
    *H03K 3/84*     (2006.01)
    *G01R 31/30*     (2006.01)
(52) U.S. Cl.
    CPC ............... *H03K 3/84* (2013.01); *G01R 31/30* (2013.01)

(58) Field of Classification Search
CPC ........................................ H03K 3/84
USPC ........................................ 327/164
See application file for complete search history.

(56) References Cited

U.S. PATENT DOCUMENTS

| | | |
|---|---|---|
| 11,372,623 B2 * | 6/2022 | Park ............... G06F 7/588 |
| 2018/0136907 A1 * | 5/2018 | Bohdan ............... G06F 7/58 |
| 2019/0373023 A1 | 12/2019 | Mordacci et al. |

\* cited by examiner

*Primary Examiner* — Tomi Skibinski
(74) *Attorney, Agent, or Firm* — IP & T GROUP LLP

(57) ABSTRACT

A random pulse generator includes: a randomness test circuit suitable for testing randomness of a random pulse; a control circuit suitable for generating frequency control information and puke control information based on a test result of the randomness test circuit; a periodic wave generating circuit suitable for generating a periodic wave whose frequency is changed based on the frequency control information; and a pulse generating circuit suitable for generating the random pulse based on the periodic wave and the pulse control information.

22 Claims, 11 Drawing Sheets

FIG. 6A

| Condition | FRQ_CHANGE |
|---|---|
| When the number of 0 in RESULT<0:4> is two or more | Activate |
| When the number of 0 in RESULT<0:4> is less than two | Deactivate |

FIG. 6B

| Condition | PULSE<0> | PULSE<1> | PULSE<2> | PULSE<3> | ... | PULSE<N-1> | PULSE<N> |
|---|---|---|---|---|---|---|---|
| Change when the number of 0 in RESULT<0:4> is 3 or more | 1 | 0 | 1 | 0 | ... | 0 | 0 |
| | 0 | 0 | 0 | 1 | ... | 0 | 1 |
| | 1 | 1 | 0 | 0 | ... | 1 | 0 |
| | ... | ... | ... | ... | ... | ... | ... |
| | 0 | 0 | 1 | 1 | ... | 1 | 1 |
| | 0 | 1 | 1 | 1 | ... | 0 | 1 |

RANDOM PULSE GENERATOR AND MEMORY

CROSS-REFERENCE TO RELATED APPLICATIONS

The present application claims priority to Korean Patent Application No. 10-2022-0069520, filed on Jun. 8, 2022, which is incorporated herein by reference in its entirety.

BACKGROUND

1. Field

Various embodiments of the present invention relate to a random pulse generator.

2. Description of the Related Art

Diverse integrated circuits such as a memory may require a circuit that operates randomly, A random pulse generator may be used to form such a circuit that operates randomly. However, it is practically impossible to design a circuit capable of generating a random pulse that may be perfectly randomly activated due to various constraints.

Therefore, a technique for correctly evaluating the randomness of a random pulse and controlling the randomness of the random pulse is needed.

SUMMARY

Embodiments of the present invention are directed to a technique for increasing the randomness of a random pulse.

In accordance with an embodiment of the present invention, a random pulse generator includes: a randomness test circuit suitable for testing randomness of a random pulse; a control circuit suitable for generating frequency control information and pulse control information based on a test result of the randomness test circuit; a periodic wave generating circuit suitable for generating a periodic wave whose frequency is changed based on the frequency control information; and a pulse generating circuit suitable for generating the random pulse based on the periodic wave and the pulse control information.

In accordance with another embodiment of the present invention, a memory includes: a memory core including memory cells that are arranged in rows and columns; a randomness test circuit suitable for testing randomness of a random pulse; a control circuit suitable for generating frequency control information and pulse control information according to a test result of the randomness test circuit; a periodic wave generating circuit suitable for generating a periodic wave whose frequency is changed based on the frequency control information; a pulse generating circuit suitable for generating the random pulse based on the periodic wave and the pulse control information; and a random sampling circuit suitable for randomly sampling, based on the random pulse, a part of the rows on which an active operation is performed.

In accordance with still another embodiment of the present invention, an operation method of a random puke generating circuit includes: generating one or more preliminary pukes according to a periodic signal and a first part of a control code; generating a random pulse from the preliminary pulses according to a second part of the control code; testing randomness of the random puke to generate a test result; and adjusting, according to the test result, a period of the periodic signal and the control signal.

BRIEF DESCRIPTION OF THE DRAWINGS

FIGS. 6A and 6B are tables presenting an operation of a control circuit in accordance with an embodiment of the present invention.

DETAILED DESCRIPTION

Figure 1:
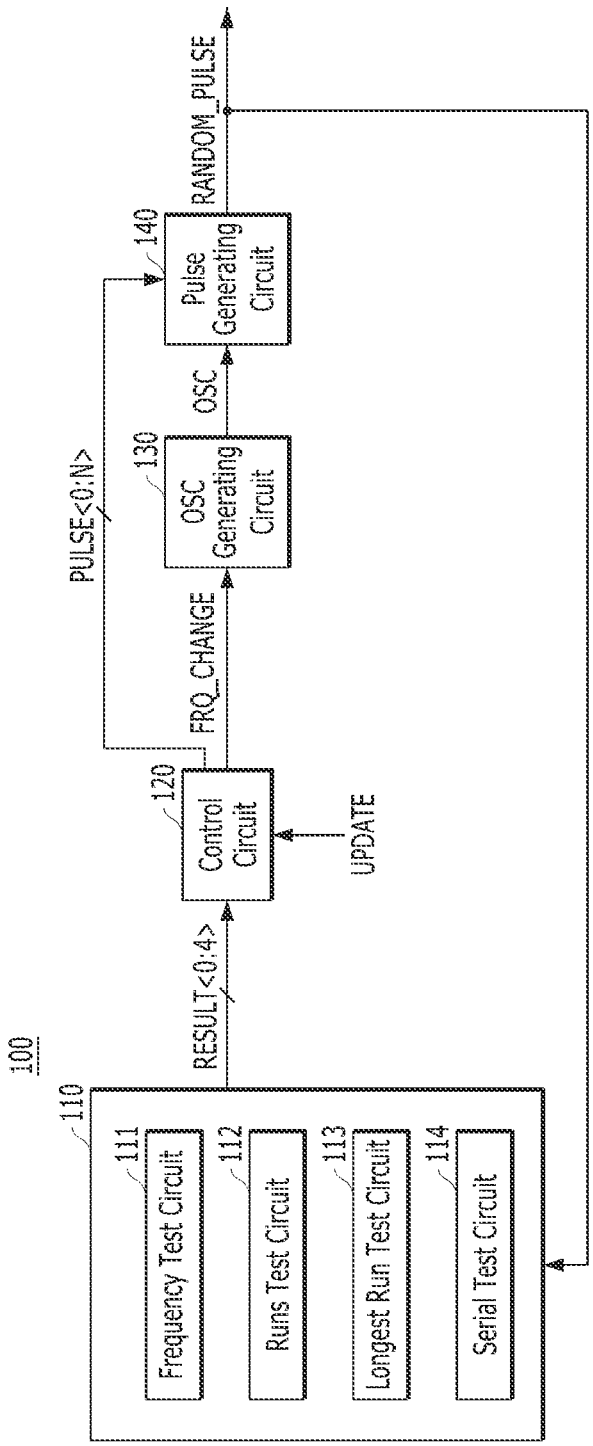
FIG. 1 is a block diagram illustrating a random pulse generator in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art, Throughout this disclosure, like reference numerals refer to like parts throughout the various figures and embodiments of the present invention.

FIG. 1 is a block diagram illustrating a random pulse generator 100 in accordance with an embodiment of the present invention.

Referring to FIG. 1, the random pulse generator 100 may include a randomness test circuit 110, a control circuit 120, a periodic wave generating circuit 130, and a pulse generating circuit 140.

The randomness test circuit 110 may test the randomness of a random pulse RANDOM_PULSE which is generated by the pulse generating circuit 140. The randomness test circuit 110 may include diverse circuits 111 to 114 for testing the randomness of several items. A frequency test circuit 111 may test the ratio of the length of a high section to the length of a low section of the random pulse RANDOM_PULSE, and the runs test circuit 112 may test the number of times that the random pulse RANDOM_PULSE transitions. Also, the longest run test circuit 113 may test the length of the longest section where the random pulse RANDOM_PULSE does not transition but maintains the same value, and a serial test circuit 114 may test whether the pattern of the random pulse RANDOM PULSE is repeated or not. As a result of testing the circuits 111 to 114, a test result RESULT<0:4> may be generated.

The control circuit 120 may generate frequency control information FRQ_CHANGE and pulse control information PULSE<0:N> based on the test result RESULT<0:4>. The control circuit 120 may be able to determine whether to activate/deactivate the frequency control information FRQ_CHANGE, and to determine the values of the pulse control information PULSE<0:N> by receiving and decoding the test result RESULT<0:4> when an update signal UPDATE is activated.

The periodic wave generating circuit 130 may generate a periodic wave OSC whose frequency is changed based on the frequency control information FRQ_CHANGE. The periodic wave generating circuit 130 may change the frequency of the periodic wave OSC whenever the frequency control information FRQ_CHANGE is activated. For example, the periodic wave generating circuit 130 may recursively change the frequency of the periodic wave OSC as 450 Mhz→500 Mhz→550 Mhz→600 Mhz→450 Mhz→500 Mhz, whenever the frequency control information FRQ_CHANGE is activated.

The pulse generating circuit 140 may generate the random pulse RANDOM_PULSE based on the periodic wave OSC and the pulse control information PULSE<0:N>, Randomness of a pulse generated by the pulse generating circuit 140 may vary according to the value of the pulse control information PULSE<0:N>.

Figure 2:
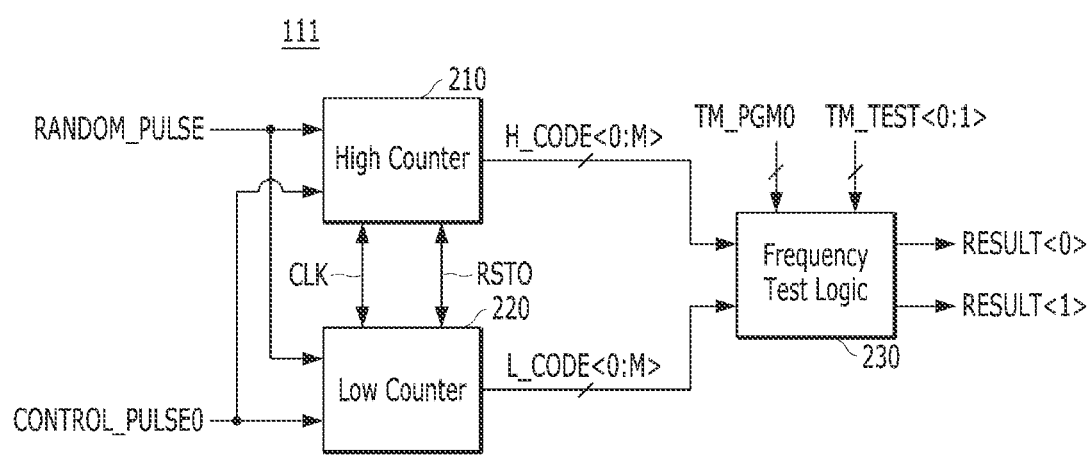
FIG. 2 is a block diagram illustrating a frequency test circuit of a randomness test circuit shown in FIG. 1 in accordance with an embodiment of the present invention.

FIG. 2 is a block diagram illustrating the frequency test circuit 111 of the randomness test circuit 110 shown in FIG. 1 in accordance with an embodiment of the present invention.

Referring to FIG. 2, the frequency test circuit 111 may include a high counter 210, a low counter 220, and a frequency test logic 230.

The high counter 210 may generate a high code H_CODE<0:M> by counting the number of times that a dock CLK is activated while the random puke RANDOM_PULSE signal is at a high level. The high code H_CODE<0:M> may indicate a length obtained by summing up the lengths of the sections where the random pulse RANDOM-_PULSE is at a high level.

The row counter 220 may generate a low code L_CODE<0:M> by counting the number of times that the clock CLK is activated while the random pulse RANDOM PULSE signal is at a low level. The low code L_CODE<0:M> may indicate a length obtained by summing up lengths of the sections where the random pulse RANDOM_PULSE is at a low level.

The control pulse CONTROL_PULSE0 input to the high counter 210 and the low counter 220 may be an activation signal of the high counter 210 and the low counter 220. The high counter 210 and the low counter 220 may be activated and operate while the control pulse CONTROL_PULSE0 is activated. When a reset signal RST0 is activated, the high counter 210 and the low counter 220 may initialize the high code H_CODE<0:M> and the low code L_CODE<0:M>.

The frequency test logic 230 may generate frequency test result signals RESULT<0:1> based on the difference between the value of the high code H_CODE<0:M> and the value of the low code L_CODE<0:M>. When a test mode signal TM_TEST<0> is activated, the frequency test logic 230 may generate a frequency test result signal RESULT<0> by performing a long test operation, and when a test mode signal TM_TEST<1> is activated, the frequency test logic 230 may generate a frequency test result signal RESULT<1> by performing a short test operation.

The long test may be a test for testing the ratio of the length of a high section to the length of a low section of the random pulse RANDOM_PULSE during a long section. During the long test, the control puke CONTROL_PULSE0 may be activated for a long time to operate the high counter 210 and the low counter 220 for a long time. When the control puke CONTROL is deactivated, the values of the high code H_CODE<0:M> and the low code L_CODE<0:M> may be fixed, and when the test mode signal TM_TEST<0> is activated, the frequency test logic 230 may determine whether or not the difference between the value of the high code H_CODE<0:M> and the value of the low code L_CODE<0:M> is equal to or less than a first threshold value. When the difference between the value of the high code H_CODE<0:M> and the value of the low code L_CODE<0:M> is equal to or less than the first threshold, the test is passed and the frequency test result signal RESULT<0> may be set to a high level. When the difference between the value of the high code H_CODE<0: M> and the value of the low code L_CODE<0:M> is greater than the first threshold, the test may fail and the frequency test result signal RESULT<0> may be generated at a low level. When the test mode signal TM_TEST<0> is deactivated, the frequency test result signal RESULT<0> may be fixed to the level which is formed when the test mode signal TM_TEST<0> is activated. Also, when the long test is completed, the reset signal RST0 may be activated to initialize the high code H_CODE<0:M> and the low code L_CODE<0:M>. When the frequency test result signal RESULT<0> is at a low level, it may mean that the randomness is insufficient because the length of the high section of the random pulse RANDOM_PULSE which is measured for a long time is longer than the length of the low section, or the length of the low section is longer than the length of the high section.

The short test may be a test for testing the ratio of the length of a high section to the length of a low section of the random pulse RANDOM_PUILSE during a relatively short section. During the short test, the control pulse CONTROL_PULSE0 may be activated for a relatively short time to operate the high counter 210 and the low counter 220 for a short time. When the control pulse CONTROL_PULSE0 is deactivated, the values of high code H_CODE<0:M> and low code L_CODE<0:M> may be fixed, and when a test mode signal TM_TEST<1> is activated, the frequency test logic 230 may determine whether or not the difference between the value of the high code H_CODE<0:M> and the value of the low code L_CODE<0:M> is equal to or less than a second threshold value. When the difference between the value of the high code H_CODE<0:M> and the value of the low code L_CODE<0:M> is equal to or less than the second threshold, the test may be passed to generate the frequency test result signal RESULT<1> at a high level. When the difference between the value of the high code H_CODE<0:M> and the value of the low code L_CODE<0:M> is greater than the second threshold, the test may fail to generate the frequency test result signal RESULT<1> at a low level. When the test mode signal TM_TEST<1> is deactivated, the frequency test result signal RESULT<1> may be fixed to the level which is formed when the test mode signal TM_TEST<1> is activated. Also, when the short test is completed, the reset signal RST0 may be activated to initialize the high code H_CODE<0:M> and the low code L_CODE<0:M>. When the frequency test result signal RESULT<1> is at a low level, it may mean that the randomness is insufficient because the length of the high section of the random pulse RANDOM_PULSE measured for a short time is longer than the length of the low section, or the length of the low section is longer than the length of the high section.

Program information TM_PGM0 input to the frequency test logic 230 may be a multi-bit signal, and may be used to adjust the first threshold value and the second threshold value that become criteria for determining pass/failure. As the first and second thresholds are adjusted to be smaller, it may become more difficult to pass the test.

Figure 3:
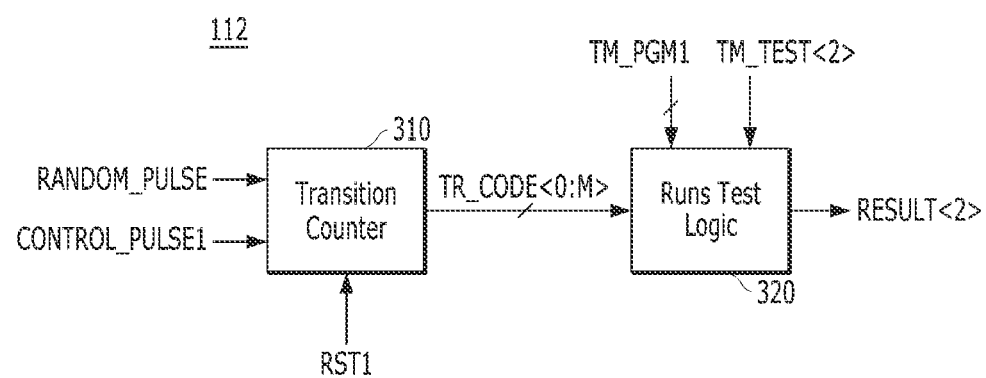
FIG. 3 is a block diagram illustrating a runs test circuit of the randomness test circuit shown in FIG. 1 in accordance with an embodiment of the present invention.

FIG. 3 is a block diagram illustrating the runs test circuit 112 of the randomness test circuit 110 shown in FIG. 1 in accordance with an embodiment of the present invention.

Referring to FIG. 3, the runs test circuit 112 may include a transition counter 310 and a runs test logic 320.

The transition counter 310 may generate a transition code TR_CODE<0:M> by counting the number of times that the random pulse RANDOM_PULSE transitions from a first level to a second level. The transition counter 310 may count the number of times that the random pulse RANDOM_PULSE transitions from low to high, or may count the number of times that the random pulse RANDOM_PULSE transitions from high to low. This is because [the number of times that the random pulse transitions from low to high]≒ [the number of times that the random pulse transitions from high to low]. A control pulse CONTROL_PULSE1 may be an activation signal of the transition counter 310, and it may operate as the transition counter 310 is activated while the control pulse CONTROL_PULSE1 is activated. When a reset signal RST1 is activated, the transition counter 310 may initialize the transition code TR_CODE<0:M>.

When the value of the transition code TR_CODE<0:M> is greater than a third threshold value, the runs test logic 320 may determine a pass and generate a runs test result signal RESULT<2> of a high level. When the value of the transition code TR_CODE<0:M> is equal to or less than the third threshold, the runs test logic 320 may determine a failure and generate a runs test result signal RESULT<2> of a low level. When the test mode signal TM_TEST<2> is activated, the runs test logic 320 may compare the value of the transition code TR_CODE<0:M> with the third threshold value to generate a runs test result signal RESULT<2>. Program information TM_PGM1 may be used to adjust the third threshold with a multi-bit signal. The greater the third threshold value is adjusted, the more difficult it may be to pass the test.

To have a look at the operation of the runs test circuit 112, while the control pulse CONTROL_PULSE1 is activated, the transition counter 310 may generate the transition code TR_CODE<0:M> by counting the number of times that the random pulse RANDOM_PULSE transitions from low to high. When the control pulse CONTROL_PULSE1 is deactivated, the value of the transition code TR_CODE<0:M> is fixed, and when the test mode signal TM_TEST<2> is activated, the runs test logic 320 may generate the runs test result signal RESULT<2> by comparing the transition code TR_CODE<0:M> with the third threshold. When the test mode signal TM_TEST<2> is deactivated, the runs test result signal RESULT<2> may be fixed to the level formed when the test mode signal TM_TEST<2> is activated. Also, when the runs test is finished, the transition code TR_CODE<0:M> may be initialized by activating the reset signal RST1. When the runs test result signal RESULT<2> is at a low level, it may mean that the number of times that the random pulse RANDOM_PULSE transitions is insufficient and thus the randomness of the random pulse RANDOM PULSE is insufficient.

Figure 4:
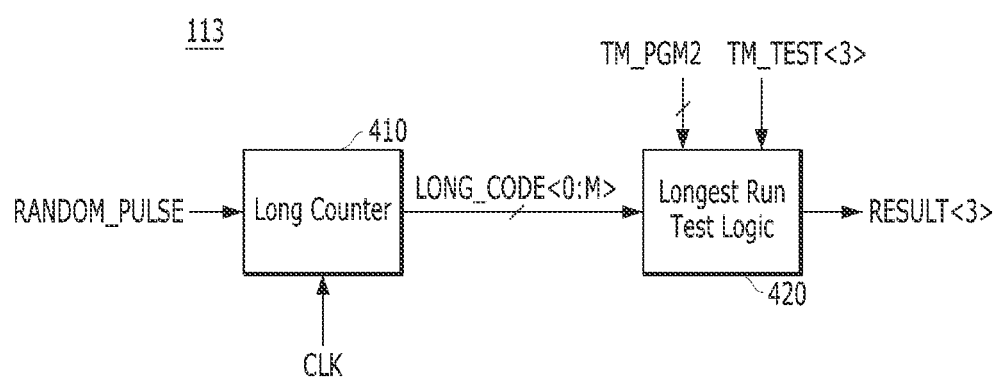
FIG. 4 is a block diagram illustrating a longest run test circuit of the randomness test circuit shown in FIG. 1 in accordance with an embodiment of the present invention.

FIG. 4 is a block diagram illustrating the longest run test circuit 113 of the randomness test circuit 110 shown in FIG. 1 in accordance with an embodiment of the present invention.

Referring to FIG. 4, the long run test circuit 113 may include a long counter 410 and a longest run test logic 420.

The long counter 410 may generate a long code LONG_CODE<0:M> by counting the number of times that a clock CLK is activated in a section where the random pulse RANDOM_PULSE is at a high level, and may initialize the long code LONG_CODE<0:M> in response to the random pulse RANDOM_PULSE of a low level. Accordingly, the long code LONG_CODE<0:M, may be newly generated whenever the random pulse RANDOM PULSE is activated to a high level.

When the value of the long code LONG_CODE<0: M> has become greater than a fourth threshold during a section where the test mode signal TM_TEST<3> is activated, the longest run test logic 420 may determine a failure and generate a longest run test result signal RESULT<3> of a low level. However, when the value of the long code LONG_CODE<0:M> is maintained equal to or less than the fourth threshold value during a section where the test mode signal TM_TEST<3> is activated, the longest run test logic 420 may determine a pass and generate a longest run test result signal RESULT<3> of a high level. When the test mode signal TM_TEST-3> is deactivated, the longest run test result signal RESULT<3> may be fixed to the level which is formed when the test mode signal TM_TEST<3> is activated. Program information TM_PGM2 may be used to adjust the fourth threshold with a multi-bit signal. The smaller the fourth threshold value is set, the more difficult it may be to pass the test. When the longest run test result signal RESULT<3> is at a low level, there is a case where the random pulse RANDOM_PULSE maintains a high level for too long without any transition, which may mean that the randomness of the random pulse RANDOM_PULSE is insufficient.

In the longest run test, the length of a section where the random pulse RANDOM_PULSE is at a high level may be generally measured, which is because circuits using a random pulse are normally formed to perform an operation related to randomness in a section where the random pulse RANDOM_PULSE is at a high level. Also, since not only the longest run test but also the runs test and the frequency test are performed, even though only the length of the section where the random puke RANDOM_PULSE is at a high level is measured, it is sufficient to verify the randomness of the random pulse RANDOM_PULSE.

Figure 5:
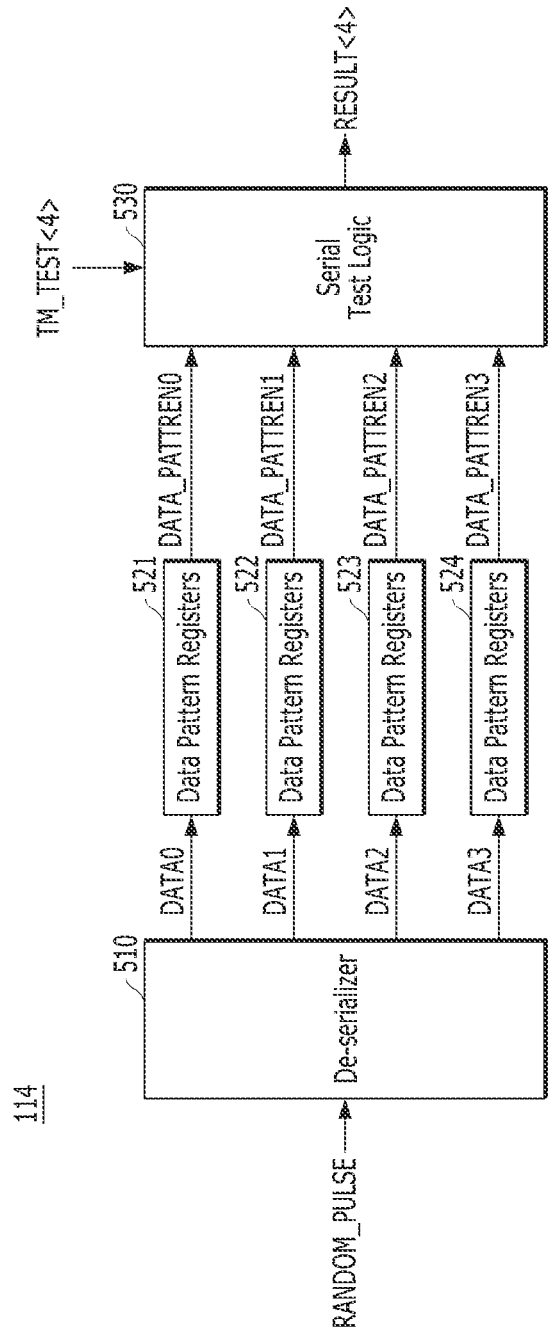
FIG. 5 is a block diagram illustrating a serial test circuit of the randomness test circuit shown in FIG. 1 in accordance with an embodiment of the present invention.

FIG. 5 is a block diagram illustrating a serial test circuit 114 of the randomness test circuit 110 shown in FIG. 1 in accordance with an embodiment of the present invention.

Referring to FIG. 5, the serial test circuit 114 may include a de-serializer 510, data pattern registers 521 to 524, and a serial test logic 530.

The de-serializer 510 may de-serialize the random puke RANDOM_PULSE on the basis of a predetermined time unit. For example, when the random puke RANDOM_PULSE is input to the de-serializer 510 during a 0 to 80 time, the random puke RANDOM_PULSE may be deserialized on the basis of a time unit of 10, and a random puke RANDOM_PULSE for a 0 to 10 time may be transferred to a data pattern register 521, and a random puke RANDOM_PULSE for a 10 to 20 time may be transferred to a data pattern register 522, and a random puke RANDOM_PULSE for a 20 to 30 time may be transferred to a data pattern register 523, and a random pulse RANDOM_PULSE for a 30 to 40 time may be transferred to a data pattern register 524. Also, a random pulse RANDOM_PULSE for a 40 to 50 time may be transferred to the data pattern register 521, and a random pulse RANDOM_PULSE for a 50 to time may also be deserialized on the basis of a 10 time unit and transferred to the data pattern registers 522 to 524. The data DATA0 to DATA3 in the figure may represent the random pukes RANDOM_PULSE deserialized by the de-serializer 510.

The data pattern registers 521 to 524 may sequentially store the data DATA0 to DATA3 that are generated by the de-serializer 510 deserializing the random puke RANDOM_PULSE.

When the same data pattern is detected among the data patterns DATA_PATTERN0 to DATA_PATTERN3 stored in the data pattern registers 521 to 524 during a section where a test mode signal TM_TEST<4> is activated, the serial test logic 530 may determine a failure and generate a serial test result signal RESULT<4> of a low level. For example, when it is detected that the data pattern DATA_PATTERN1 and the data pattern DATA_PATTERN3 are the same during an activation section of the test mode signal TM_TEST<4>, the serial test logic 530 may generate a serial test result signal RESULT<4> of a low level. However, when the same data pattern has never been detected among the data patterns DATA_PATTERN0 to DATA_PATTERN3 during the activation section of the test mode signal TM_TEST<4>, the serial test logic 530 may determine a pass and generate a serial test result signal RESULT<4> of a high level. When the test mode signal TM_TEST<4> is deactivated, the serial test result signal RESULT<4> may be fixed to the level which is formed when the test mode signal TM_TEST<4> is activated. When the serial test result signal RESULT<4> is at a low level, it may mean that the random pulse RANDOM_PULSE has the same pattern repeated and thus the randomness of the random puke RANDOM_PULSE is insufficient.

FIGS. 6A and 6B are tables presenting an operation of the control circuit 120 in accordance with an embodiment of the present invention. An operation of the control circuit 120 will be described by referring to FIGS. 6A, 6B, and 1.

The control circuit 120 may generate the frequency control information FRQ_CHANGE and the pulse control information PULSE<0:N> by decoding the test result RESULT<0:4> of the randomness test circuit 110 when an update signal UPDATE is activated. The frequency control information FRQ_CHANGE and the pulse control information PULSE<0:N> may be updated whenever the update signal UPDATE is activated.

Referring to FIG. 6A, when the test result RESULT<0:4> indicates a failure in two or more tests, that is, when two or more among the five test result signals RESULT<0:4> are at a low level, the frequency control information FRQ_CHANGE may be activated. When the frequency control information FRQ_CHANGE is activated, the periodic wave generating circuit 130 may change the frequency of the periodic wave OSC.

Referring to FIG. 6B, when the test result RESULT<0:4> indicates a failure in three or more tests, that is, when three or more among the five test result signals RESULT<0:4> are at a low level, the pulse control information PULSE<0:N> may be changed, FIG. 6B shows an example where the puke control information PULSE<0:N> is recursively changed whenever a condition is satisfied. For example, when the puke control information PULSE<0:N> is (1,0,1,0, . . . ,0,0) and three or more among the test result signals RESULT<0:4> are at a low level, the pulse control information PULSE<0:N> may be changed to (0,0,0,1, . . . ,0,1).

When the number of failures in the test result is equal to or greater than a predetermined number, the control circuit 120 may determine that the randomness of the random pulse RANDOM_PULSE is insufficient and thus the control circuit 120 may perform a control to increase the randomness of the random pulse RANDOM_PULSE by changing the frequency control information FRQ_CHANGE and the pulse control information PULSE<0:N>.

Program information TM_PGM3 input to the control circuit 120 may be a multi-bit signal, and the program information TM_PGM3 may be used to control the number of the failures related to a condition for activating the frequency control information FRQ_CHANGE and the number of failures related to a condition for changing the pulse control information PULSE<0:N>, FIGS. 6A and 6B are mere examples of the decoding method of the control circuit 120, it would be apparent to those skilled in the art that the control circuit 120 may use diverse decoding methods which are different from those of FIGS. 6A and 6B.

Figure 7:
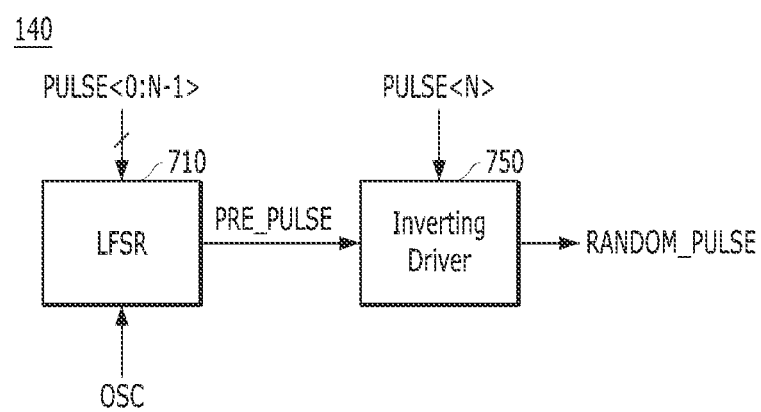
FIG. 7 is a block diagram illustrating a pulse generating circuit shown in FIG. 1 in accordance with an embodiment of the present invention.

FIG. 7 is a block diagram illustrating the pulse generating circuit 140 shown in FIG. 1 in accordance with an embodiment of the present invention.

Referring to FIG. 7, the pulse generating circuit 140 may include a linear feedback shift register (LFSR) 710 and an inverting driver 750.

The linear feedback shift register 710 may operate in synchronization with the periodic wave OSC, and have feedback characteristics determined based on feedback information PULSE<0:N-1> of the pulse control information PULSE<0:N>. The linear feedback shift register 710A may generated a preliminary pulse signal PRE_PULSE, The randomness of the preliminary pulse signal PRE_PULSE may be changed according to the feedback characteristics determined based on the frequency of the periodic wave OSC and the feedback information PULSE<0:

The inverting driver 750 may generate the random pulse RANDOM_PULSE by inverting or not inverting the preliminary pulse signal PRE_PULSE based on the inversion information PULSE<N> of the pulse control information PULSE<0:N> When the inversion information PULSE<N> is at a high level, the inverting driver 750 may generate the random pulse RANDOM_PULSE by inverting the preliminary pulse PRE_PULSE, and when the inversion information PULSE<N> is at a low level, the inverting driver 750 may generate the random pulse RANDOM_PULSE by not inverting and outputting the preliminary pulse PRE_PULSE as it is.

Figure 8:
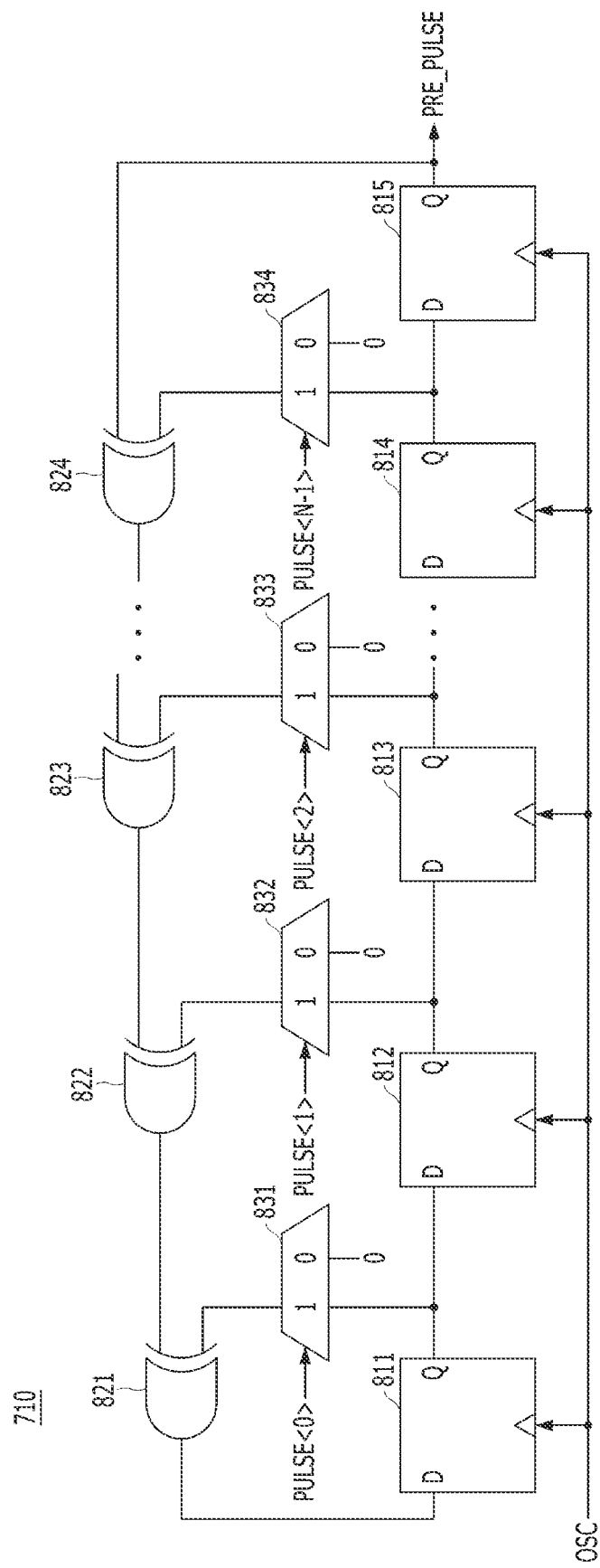
FIG. 8 is a block diagram illustrating a linear feedback shift register shown in FIG. 7 in accordance with an embodiment of the present invention.

FIG. 8 is a block diagram illustrating the linear feedback shift register 710 shown in FIG. 7 in accordance with an embodiment of the present invention.

Referring to FIG. 8, the linear feedback shift register 710 may include D flip-flops 811 to 815 that are coupled serially, XOR gates 821 to 824 for feedback, and selection circuits 831 to 834 for determining the feedback characteristics of the linear feedback shift register 710 based on the feedback information PULSE<0:N-1>.

The XOR gates 821 to 824 may be used for the feedback of the D flip-flops 811 to 815, and the feedback characteristics may be determined by the selection of the selection circuits 831 to 834 based on the feedback information PULSE<0:N-1>, For example, when PULSE<2> is '0', the selection circuit 833 may select '0' and input it to an XOR gate 823, and when PULSE<2> is '1', the selection circuit 833 may select an output of the D flip-flop 813 and input it to the XOR gate 823, Also, when PULSE<N-1> is '0', the selection circuit 834 may select '0' and input it to an XOR gate 824, and when PULSE<N-1> is '1', the selection circuit 834 may select an output of the D flip-flop 814 and input it to the XOR gate 824. The feedback characteristics of the linear feedback shift register 710 may be determined according to what the selection circuits 831 to 834 select based on the feedback information PULSE<0:N-1>.

Each of the D flip-flops 811 to 815 may be initialized to predetermined initial values. For example, the D flip-flop 811 may be initialized to 1, and the D flip-flop 812 may be initialized to 0, and the D flip-flop 813 may be initialized to 1, and the D flip-flop 814 may be initialized to 0, and the D flip-flop 815 may be initialized to 1. Also, the D flip-flops 811 to 815 may perform a shift operation whenever the periodic wave OSC is activated. The signals shifted by the D flip-flops 811 to 815 may be logically combined and fed back according to the feedback information PULSE<0:N-1>, Therefore, the signals shifted by the D flip-flops 811 to 815 may have random characteristics.

The preliminary pulse PRE_PULSE may be output from the D flip-flop 815.

Figure 9:
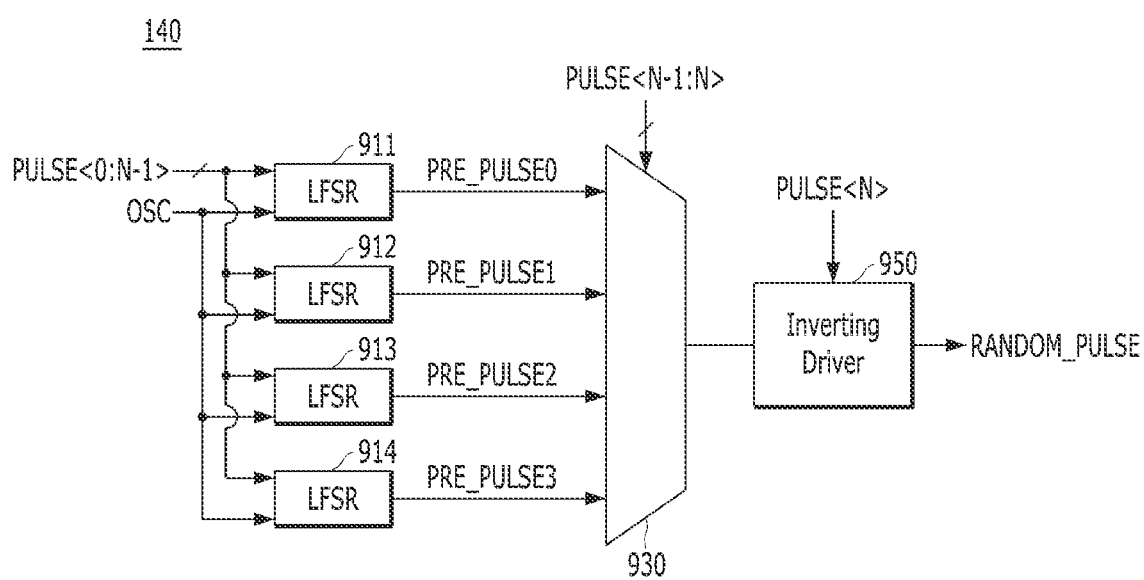
FIG. 9 is a block diagram illustrating the puke generating circuit shown in FIG. 1 in accordance with another embodiment of the present invention.

FIG. 9 is a block diagram illustrating the pulse generating circuit 140 shown in FIG. 1 in accordance with another embodiment of the present invention.

Referring to FIG. 9, the pulse generating circuit 140 may include a plurality of linear feedback shift registers 911 to 914, a selection circuit 930, and an inverting driver 950.

Each of the linear feedback shift registers 911 to 914 may operate in synchronization with the periodic wave OSC, and the feedback characteristics may be determined based on the feedback information PULSE<0:N-1> of the pulse control information PULSE<0:N>. Preliminary pulse signals PRE_PULSE0 to PRE_PULSE3 may be generated from each of the linear feedback shift registers 911 to 914.

Each of the linear feedback shift registers 911 to 914 may be formed as shown in FIG. 8. However, the linear feedback shift registers 911 to 914 may have different feedback characteristics. For example, the order that each of the linear feedback shift registers 911 to 914 receives the feedback information PULSE<0:N-1> may be different. The selection circuits 831 to 834 of the linear feedback shift register 911 may receive the feedback information PULSE<0:N-1> in the order of PULSE<0>, PULSE<1>, PULSE<3>, PULSE<N-1> as shown in FIG. 8, and the selection circuits 831 to 834 of the linear feedback shift register 912 may receive the feedback information PULSE<0:N-1> in the order of PULSE<N-1>, PULSE<N-2>, PULSE<0>. Also, the linear feedback shift registers 913 and 914 may receive the feedback information PULSE<0:N-1> in an order different from those of the linear feedback shift registers 911 and 912. Also, the number of the stages of the linear feedback shift registers 911 to 914 may be different from each other.

Since the linear feedback shift registers 911 to 914 have different feedback characteristics and may have different stages, the preliminary pulse signals PRE_PULSE0 to PRE_PULSE3 generated by the linear feedback shift registers 911 to 914 may have different randomness.

The selection circuit 930 may select one among the preliminary pulse signals PRE_PULSE0 to PRE_PULSE3 based on the selection information PULSE<N-1:N> of the pulse control information PULSE<0:N>. Since the selection information PULSE<N-1:N> is of 2 bits, one among the four preliminary pulse signals PRE_PULSE0 to PRE_PULSE3 may be selected based on the selection information PULSE<N-1:N>.

The inverting driver 950 may generate a random pulse RANDOM_PUILSE by inverting or not inverting the preliminary puke signal which is selected by the selection circuit 930 based on the inversion information PULSE<N> of the puke control information PULSE<0:N>.

PULSE<N-1> of the puke control information PULSE<0:N> may also be used as the feedback information which is used by the linear feedback shift registers 911 to 914 and may be used as the selection information which is used by the selection circuit 930. Also, PULSE<N> may be used as the selection information which is used by the selection circuit 930 and the inversion information which is used by the inverting driver 950.

Figure 10:
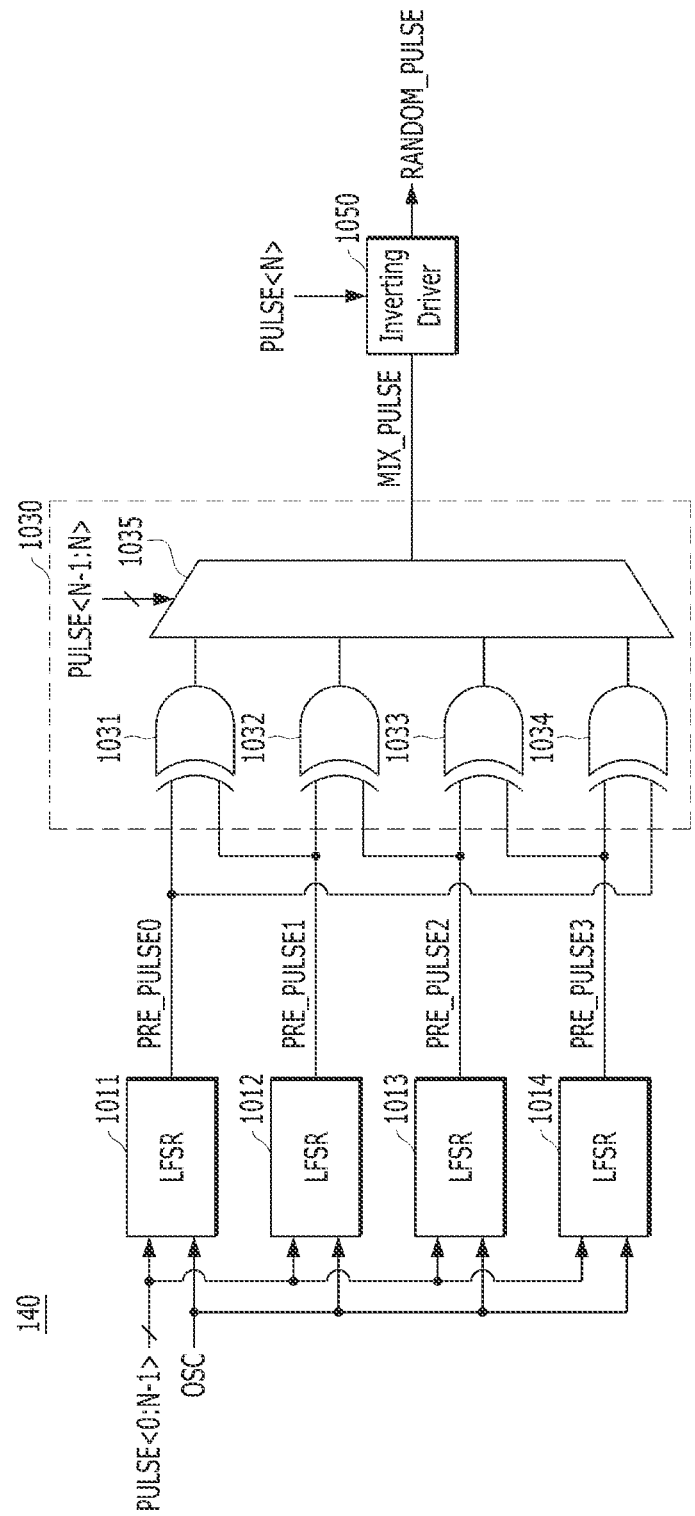
FIG. 10 is a block diagram illustrating the pulse generating circuit shown in FIG. 1 in accordance with yet another embodiment of the present invention.

Since the puke generating circuit 140 of FIG. 9 uses a plurality of the linear feedback shift registers 911 to 914, it may generate a random puke RANDOM_PULSE with increased randomness, compared to the puke generating circuit 140 of FIG. 8, FIG. 10 is a block diagram illustrating the pulse generating circuit 140 shown in FIG. 1 in accordance with yet another embodiment of the present invention.

Referring to FIG. 10, the puke generating circuit 140 may include a plurality of linear feedback shift registers 1011 to 1014, a mixing circuit 1030, and an inverting driver 1050.

Each of the linear feedback shift registers 1011 to 1014 may operate in synchronization with a periodic wave OSC and may have its feedback characteristics determined based on feedback information PULSE<0:N-1> of pulse control information PULSE<0:N>. The linear feedback shift registers 1011 to 1014 may generate preliminary pulse signals PRE_PULSE0 to PRE_PULSE3. The linear feedback shift registers 1011 to 1014 may have different feedback characteristics and different stages.

The mixing circuit 1030 may generate a mixing pulse MIX_PULSE by logically combining two or more among the preliminary pulse signals PRE_PULSE0 to PRE_PULSE3 based on the mixing information PULSE<N-1> and PULSE<N> of the pulse control information PULSE<0:N>. The mixing circuit 1030 may include XOR gates 1031 to 1034 and a selection circuit 1035.

The XOR gate 1031 may output a logical combination of the preliminary puke PRE_PULSE0 and the preliminary puke PRE_PULSE1, and the XOR gate 1032 may output a logical combination of the preliminary pulse PRE_PULSE1 and the preliminary pulse PRE_PULSE2. Also, the XOR gate 1033 may output a logical combination of the preliminary pulse PRE_PULSE2 and the preliminary pulse PRE_PULSE3, and the XOR gate 1034 may output a logical combination of the preliminary pulse PRE_PULSE3 and the preliminary pulse PRE_PULSE0.

The selection circuit 1035 may select one among the outputs of the XOR gates 1031 to 1034 in response to the mixing information PULSE<N-1> and PULSE<N> and outputs it as a mixing pulse MIX_PULSE.

The inverting driver 1050 may generate the random pulse RANDOM_PULSE by inverting or not inverting the mixing pulse MIX_PULSE which is generated by the mixing circuit 1030 based on the inversion information PULSE<N> of the pulse control information PULSE<0:N>.

PULSE<N-1> of the pulse control information PULSE<0:N> may also be used as the feedback information which is used by the linear feedback shift registers 1011 to 1014 and the mixing information which is used by the mixing circuit 1030. Also, PULSE<N> may be used as the mixing information which is used by the mixing circuit 1030 and the inversion information which is used by the inverting driver 1050.

The pulse generating circuit 140 of FIG. 10 may generate a plurality of preliminary pulses PRE_PULSE0 to PRE_PULSE3 by using a plurality of linear feedback shift registers 1011 to 1014, and generate the random pulse RANDOM_PULSE by mixing and inverting or not inverting the preliminary pulses PRE_PULSE0 to PRE_PULSE3, As a result, the pulse generating circuit 140 of FIG. 10 may generate a random pulse RANDOM_PULSE with increased randomness, compared to the pulse generating circuit 140 of FIG. 8.

Figure 11:
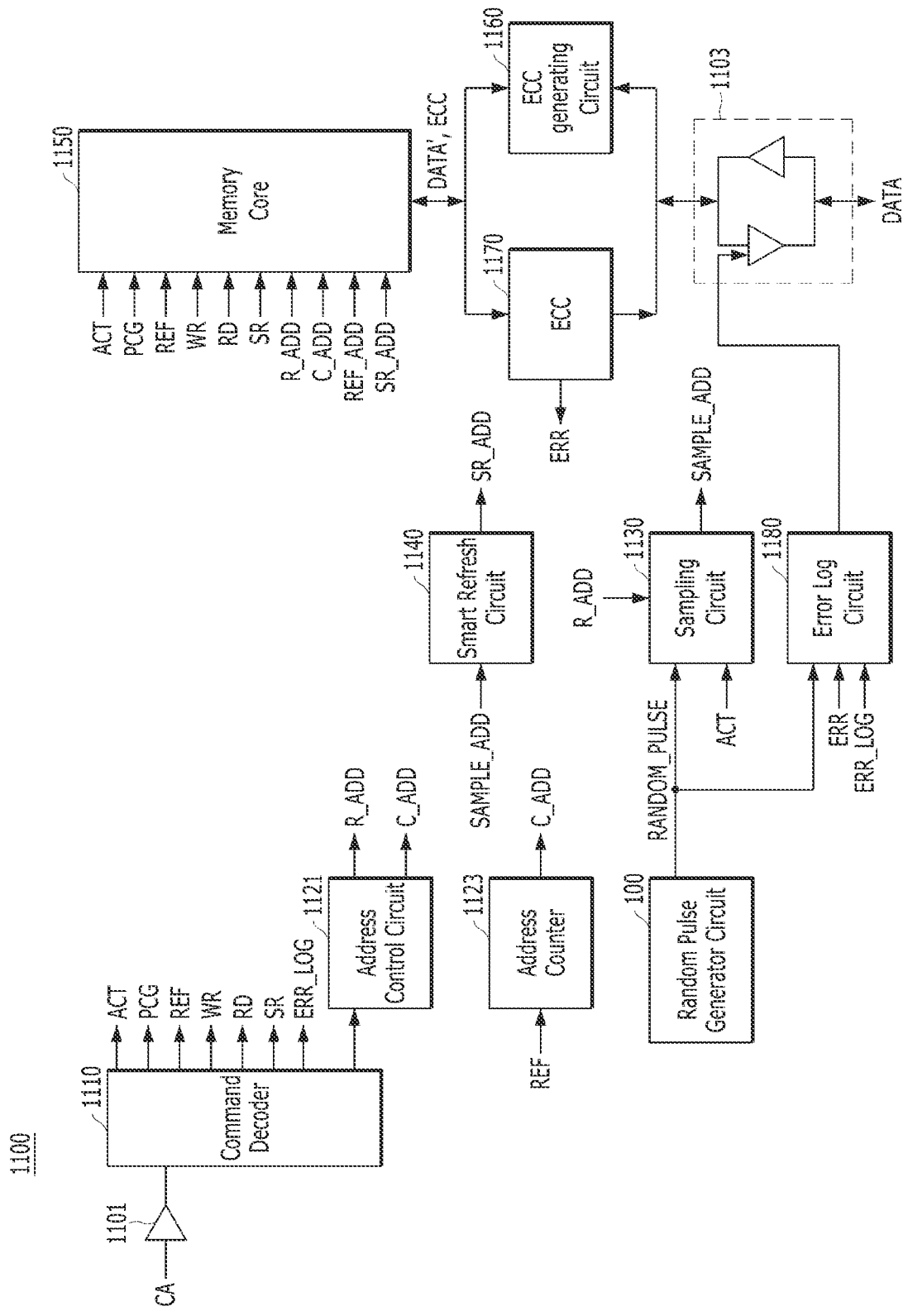
FIG. 11 is a block diagram illustrating a memory including the random puke generator shown in FIG. 1 in accordance with an embodiment of the present invention.

FIG. 11 is a block diagram illustrating a memory 1100 including the random pulse generator 100 shown in FIG. 1 in accordance with an embodiment of the present invention.

Referring to FIG. 11, the memory 1100 may include a command address receiving circuit 1101, a data transferring and receiving circuit 1103, a command decoder 1110, an address control circuit 1121, an address counter 1123, a random pulse generator 100, a sampling circuit 1130, a smart refresh circuit 1140, a memory core 1150, an error correction code generating circuit 160, an error correction circuit 1170, and an error log circuit 1180.

The command address receiving circuit 1101 may receive a command and an address CA. Depending on the type of the memory 1100, a command and an address may be input to the same input terminals, or a command and an address may be input to separate input terminals. Herein, it is illustrated that a command and an address are the same input terminals. The command and the address CA may be of multiple bits.

The data transferring/receiving circuit 1103 may receive or transfer data DATA. The data transferring/receiving circuit 1103 may receive data DATA to be written into the memory core 1150 from a memory controller during a write operation, and receive data DATA that are read from the memory core 1150 to the memory controller during a read operation.

The command decoder 1110 may decode the command and the address CA to find out the type of the operation commanded by the memory controller to the memory 1100, and generate internal command signals ACT, PCG, REF, WR, RD and SR. An active signal ACT may be a signal which is activated when an active operation is commanded, and a precharge signal PCG may be a signal which is activated when a precharge operation is commanded, A refresh signal REF may be a signal which is activated when an (auto) refresh operation is commanded. A write signal WR may be a signal which is activated when a write operation is commanded, and a read signal RD may be a signal which is activated when a read operation is commanded. Also, a smart refresh signal SR may be a signal which is activated when a smart refresh operation is commanded. Also, an error log signal ERR_LOG may be a signal which is activated when the memory controller requests error information.

The address control circuit 1121 may determine an address received from the command decoder 1110 as a row address R_ADD and a column address C_ADD. When it is found out as a result of the decoding of the command decoder 1110 that an active operation is directed, the address control circuit 1121 may classify the received address as a row address R_ADD, and when read and write operations are commanded, the address control circuit 1121 may classify the received address as a column address C_ADD. Since the row address R_ADD is an address designating a row on which an active operation is to be performed, it may also be referred to as an active address.

The address counter 1123 may generate a refresh address REF_ADD to be used for a refresh operation. The address counter 1123 may change the refresh address REF_ADD by +1 whenever the refresh signal REF is activated. Since the refresh address REF_ADD is changed whenever the refresh signal REF is activated, the rows of the memory core 1150 may be sequentially refreshed.

The random pulse generator 100 may generate a random pulse RANDOM_PULSE which is randomly activated. As illustrated in FIGS. 1 to 10, the random pulse generator 100 may perform diverse test operations for the randomness of the random pulse RANDOM_PULSE, and when it is determined as a result of the tests that the randomness of the random pulse RANDOM_PULSE is insufficient, diverse parameters related to the randomness of the random pulse RANDOM_PULSE may be changed. In this way, the random pulse RANDOM_PULSE may be secured with high randomness.

The sampling circuit 1130 may sample and store a row address when the active signal ACT and the random pulse RANDOM_PULSE are activated, Since the random pulse RANDOM_PULSE is a signal that is randomly activated, some of the row addresses on which active operations are performed may be randomly selected and sampled. The address SAMPLE_ADD which is sampled by the sampling circuit 1130 may be determined as an address on which an active operation is excessively performed in terms of probability.

The smart refresh circuit 1140 may provide the memory core 1150 with a smart refresh address SR_ADD so that the neighboring rows of a row corresponding to the address SAMPLE_ADD which is sampled by the sampling circuit 1130 may be refreshed when the smart refresh signal SR is activated. The smart refresh address SR_ADD may be an address corresponding to a row which is adjacent to the row corresponding to the sampled address SAMPLE_ADD, Since the sampled address SAMPLE_ADD is an address that has a high probability of being an address that has been activated excessively many times, a row positioned adjacent to the row corresponding to the sampled address SAMPLE_ADD may be a row that has been row-hammer-attacked. The smart refresh circuit 1140 may provide the memory core 1150 with the row address SR_ADD corresponding to the row which is row-hammer-attacked to during a smart refresh operation so that the row-hammer-attacked row may be refreshed. Herein, the row hammer attack may refer to a phenomenon in which data of memory cells in the row positioned adjacent to the row that has been activated excessively many times get lost, and the smart refresh operation may mean an operation of refreshing the memory cells in a row with a high probability of data loss due to the row hammer attack.

The error correction code generating circuit 1160 may generate an error correction code ECC based on the data DATA received through the data transferring/receiving circuit 1103. The error correction code generating circuit 1160 may encode the data DATA to generate an error correction code ECC for correcting an error in the data DATA. Since the error correction code generating circuit 1160 only generates the error correction code ECC and does not perform an error correction operation, the data DATA input to the error correction code generating circuit 1160 and the data DATA' output from the error correction code generating circuit 1160 may be the same.

The error correction circuit 1170 may correct an error in the data DATA' read from the memory core 1150 based on the error correction code ECC read from the memory core 1150. Herein, correcting an error may mean detecting an error in the data DATA' based on the error correction code and correcting the error when the error is detected. The error information ERR output from the error correction circuit 1170 may be information on the error detected by the error correction circuit 1170.

The error log circuit 1180 may log the error information ERR of the error correction circuit 1170 based on the random pulse RANDOM_PULSE. Since numerous errors are detected during an operation of a memory, many resources are required to store all these errors. However, since the error log circuit 1180 randomly logs in the error information of the error correction circuit 1170 only when the random puke RANDOM_PULSE is activated. It is possible to log in the error information with a small amount of resources. The error information ERR stored in the error log circuit 1180 may be transferred to the memory controller through the data transferring/receiving circuit 1103 when an error log signal ERR_LOG is activated, that is, when there is a request from the memory controller.

The memory core 1150 may perform operations indicated by the internal command signals ACT, PCG, REF, WR, RD, and SR, The memory core 1150 may include a cell array including a plurality of memory cells that are arranged in a plurality of rows and a plurality of columns, a row circuit for controlling a row operation of the cell array, and a column circuit for controlling a column operation in which data are input to or output from the cell array. Each of the memory cells may include a cell capacitor and a cell transistor. When the active signal ACT is activated, a row selected based on the row address R_ADD among the rows of the memory core 1150 may be activated. When the precharge signal PCG is activated, the row activated during the active operation may be deactivated. When the write signal WR is activated, the data DATA' and the error correction code ECC may be written into the columns selected based on the column address C_ADD among the columns of the memory core 1150, and when the read signal RD is activated, the data DATA' and the error correction code ECC may be read from the columns selected based on the column address C_ADD among the columns of the memory core 1150, When the refresh signal REF is activated, a row selected based on the refresh address REF_ADD among the rows of the memory core 1150 may be refreshed. Also, when the smart refresh signal SR is activated, a row selected based on the smart refresh address among the rows of the memory core 1150 may be refreshed.

According to the embodiments of the present invention, the randomness of a random pulse may be increased.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments,

What is claimed is:

1. A random puke generator comprising:
a randomness test circuit suitable for testing randomness of a random pulse;
a control circuit suitable for generating frequency control information and pulse control information based on a test result of the randomness test circuit;
a periodic wave generating circuit suitable for generating a periodic wave whose frequency is changed based on the frequency control information; and
a pulse generating circuit suitable for generating the random pulse based on the periodic wave and the puke control information.

2. The random pulse generator of claim 1, wherein the randomness test circuit includes:
a frequency test circuit suitable for testing a ratio of a length of a high section to a length of a low section of the random pulse;
a runs test circuit suitable for testing a number of times that the random pulse transitions;
a longest run test circuit suitable for testing a length of a longest section in which the random pulse does not transition and maintains the same value; and
a serial test circuit suitable for testing whether the random pulse has a repeated pattern or not.

3. The random pulse generator of claim 1,
wherein the randomness test circuit includes a frequency test circuit suitable for testing a ratio of a length of a high section to a length of a low section of the random pulse, and
wherein the frequency test circuit includes:
a high counter suitable for generating a high code by counting a number of times that a clock is activated while the random pulse is at a high level;
a low counter suitable for generating a low code by counting a number of times that the clock is activated while the random pulse is at a low level; and
a frequency test logic suitable for generating one or more frequency test result signals based on a difference between a value of the high code and a value of the low code.

4. The random pulse generator of claim 3,
wherein the frequency test circuit tests the ratio by performing a long test operation in which the high counter and the low counter operate for a long section, and a short test operation in which the high counter and the low counter operate for a short section, and
wherein the frequency test logic generates:
a first frequency test result signal by comparing a first threshold with a difference between values of the high and low codes that are generated during the long test operation, and
a second frequency test result signal by comparing a second threshold with a difference between the values of the high and low codes that are generated during the short test operation.

5. The random pulse generator of claim 1,
wherein the randomness test circuit includes a runs test circuit suitable for testing a number of times that the random pulse transitions, and
wherein the runs test circuit includes:
a transition counter suitable for generating a transition code by counting a number of times that the random pulse transitions from a first level to a second level; and
a runs test logic suitable for generating a runs test result signal by comparing a value of the transition code with a third threshold.

6. The random pulse generator of claim 1,
wherein the randomness test circuit includes a longest run test circuit suitable for testing whether a length of a section where the random pulse does not transition but maintains the same value exceeds a threshold, and
wherein the longest run test circuit includes:

a long counter suitable for generating a long code by counting a number of times that a clock is activated during a section where the random pulse is high and suitable for initializing the long code in response to the random pulse becoming low; and a longest run test logic suitable for generating a longest run test result signal indicating a fail result when the long code is greater than a fourth threshold.

7. The random pulse generator of claim 1,
wherein the randomness test circuit includes a serial test circuit suitable for testing whether the random pulse has a repeated pattern or not, and
wherein the serial test circuit includes:
a de-serializer suitable for de-serializing the random pulse on a basis of a predetermined time unit;
a plurality of data pattern registers suitable for sequentially storing deserialized data obtained from the de-serializer; and
a serial test logic suitable for generating a serial test result signal indicating a fail result when two or more of the data pattern registers store the same data.

8. The random pulse generator of claim 1,
wherein the test result of the randomness test circuit includes multi-bit test signals,
wherein the puke control information includes multi-bit code signals, and
wherein the control circuit generates the frequency control information and puke control information by decoding the mufti-bit test signals to activate or deactivate the frequency control information and to determine values of the multi-bit code signals.

9. The random pulse generator of claim 1, wherein the periodic wave generating circuit generates the periodic wave by changing the frequency whenever the frequency control information is activated.

10. The random pulse generator of claim 1, wherein the pulse generating circuit includes:
a linear feedback shift register (LFSR) suitable for generating a preliminary puke signal in synchronization with the periodic wave, the LFSR having feedback characteristics depending on feedback information which is included in the pulse control information; and
an inverting driver suitable for generating the random pulse by inverting or not inverting the preliminary pulse signal based on inversion information which is included in the pulse control information.

11. The random pulse generator of claim 1,
wherein the puke generating circuit includes:
a plurality of linear feedback shift registers (LFSRs) suitable for generating a plurality of preliminary pulse signals in synchronization with the periodic wave, the LFSRs having different feedback characteristics depending on feedback information which is included in the pulse control information;
a selection circuit suitable for selecting and outputting one of the preliminary pulse signals based on selection information which is included in the pulse control information; and
an inverting driver suitable for generating the random pulse by inverting or not inverting the selected preliminary pulse signal based on inversion information which is included in the pulse control information, and
wherein the linear feedback shift registers have different numbers of stages from each other.

12. The random pulse generator of claim 1,
wherein the pulse generating circuit includes:
a plurality of linear feedback shift registers (LFSRs) suitable for generating a plurality of preliminary pulse signals in synchronization with the periodic wave, the LFSRs having different feedback characteristics depending on feedback information which is included in the pulse control information;
a mixing circuit suitable for outputting a mixing pulse by logically combining two or more among the preliminary puke signals based on mixing information included in the pulse control information; and
an inverting driver suitable for generating the random pulse by inverting or not inverting the mixing puke based on inversion information which is included in the pulse control information, and
wherein the linear feedback shift registers have different numbers of stages from each other.

13. A memory comprising:
a memory core including memory cells that are arranged in rows and columns;
a randomness test circuit suitable for testing randomness of a random pulse;
a control circuit suitable for generating frequency control information and pulse control information according to a test result of the randomness test circuit;
a periodic wave generating circuit suitable for generating a periodic wave whose frequency is changed based on the frequency control information;
a pulse generating circuit suitable for generating the random pulse based on the periodic wave and the pulse control information; and
a random sampling circuit suitable for randomly sampling, based on the random pulse, a part of the rows on which an active operation is performed.

14. The memory of claim 13, further comprising:
an error correction circuit suitable for correcting an error in data read from the memory core; and
an error log circuit suitable for:
randomly logging, based on the random pulse, an error detected by the error correction circuit, and
transferring, in response to a request for error information from a memory controller, error information on the logged error to the memory controller.

15. The memory of claim 14, further comprising a refresh circuit suitable for performing a smart refresh operation on neighboring rows of the sampled row.

16. The memory of claim 13,
wherein the test result of the randomness test circuit includes multi-bit test signals,
wherein the pulse control information includes multi-bit code signals, and
wherein the control circuit generates the frequency control information and pulse control information by decoding the multi-bit test signals to activate or deactivate the frequency control information and to determine values of the multi-bit code signals.

17. The memory of claim 13, wherein the randomness test circuit includes:
a frequency test circuit suitable for testing a ratio of a length of a high section to a length of a low section of the random pulse;
a runs test circuit suitable for testing a number of times that the random pulse transitions;
a longest run test circuit suitable for testing a length of a longest section where the random pulse does not transition but maintains the same value; and a serial test circuit suitable for testing whether the random pulse has a repeated pattern or not.

18. The memory of claim 13, wherein the pulse generating circuit includes:
a linear feedback shift register (LFSR) suitable for generating a preliminary pulse signal in synchronization with the periodic wave, the LFSR having feedback characteristics depending on feedback information which is included in the pulse control information; and
an inverting driver suitable for generating the random pulse by inverting or not inverting the preliminary pulse signal based on inversion information which is included in the pulse control information.

19. The memory of claim 13,
wherein the puke generating circuit includes:
a plurality of linear feedback shift registers (LFSRs) suitable for generating a plurality of preliminary pulse signals in synchronization with the periodic wave, the LFSRs having different feedback characteristics depending on feedback information which is included in the puke control information;
a selection circuit suitable for selecting and outputting one of the preliminary pulse signals based on selection information which is included in the pulse control information; and
an inverting driver suitable for generating the random pulse by inverting or not inverting the selected preliminary pulse signal based on inversion information which is included in the pulse control information, and
wherein the linear feedback shift registers have different numbers of stages from each other.

20. The memory of claim 13, wherein the pulse generating circuit includes:
a plurality of linear feedback shift registers (LFSRs) suitable for generating a plurality of preliminary pulse signals in synchronization with the periodic wave, the LFSRs having different feedback characteristics depending on feedback information which is included in the puke control information;
a mixing circuit suitable for outputting a mixing puke by logically combining two or more among the preliminary puke signals based on mixing information which is included in the pulse control information; and
an inverting driver suitable for generating the random pulse by inverting or not inverting the mixing puke based on inversion information which is included in the puke control information, and
wherein the linear feedback shift registers have different numbers of stages from each other.

21. An operating method of a random pulse generating circuit, the operating method comprising:
generating one or more preliminary pulses according to a periodic signal and a first part of a control code;
generating a random pulse from the preliminary pulses according to a second part of the control code;
testing randomness of the random pulse to generate a test result; and
adjusting, according to the test result, a period of the periodic signal and the control code.

22. The operating method of claim 21, wherein the test result includes one or more of:
a first result representing whether difference of total lengths between high and low levels of the random puke during a first time section falls within a first threshold,
a second result representing whether a number of transitions of the random pulse during a second time section is greater than a second threshold,
a third result representing whether duration of the high level as greater than a third threshold during a third time section, and
a fourth result representing whether patterns of the random pulse within different time sections are the same as each other.

* * * * *